(12) United States Patent
Rozenblit et al.

(10) Patent No.: US 6,545,554 B1
(45) Date of Patent: Apr. 8, 2003

(54) DIFFERENTIAL OSCILLATOR

(75) Inventors: Dmitriy Rozenblit, Irvine, CA (US); Mark Oskowsky, San Jose, CA (US); William J. Domino, Yorba Linda, CA (US); Darioush Agahi-Kesheh, Irvine, CA (US)

(73) Assignee: Skyworks Solutions, Inc., Newport Beach, CA (US)

( * ) Notice: Subject to any disclaimer, the term of this patent is extended or adjusted under 35 U.S.C. 154(b) by 0 days.

(21) Appl. No.: 09/675,239

(22) Filed: Sep. 29, 2000

(51) Int. Cl.$^7$ .................................................. H03B 5/18
(52) U.S. Cl. .............................. 331/117 R; 331/177 V; 331/36 C; 331/175; 331/167
(58) Field of Search ............................ 331/117 R, 167, 331/177 V, 117 FE, 175, 36 C

(56) References Cited

U.S. PATENT DOCUMENTS

| | | | |
|---|---|---|---|
| 5,937,340 A | * | 8/1999 | Philippe et al. ............. 455/310 |
| 6,150,893 A | * | 11/2000 | Fattaruso ................ 331/117 R |
| 6,342,820 B1 | * | 1/2002 | Leyten et al. ........... 331/117 D |

* cited by examiner

*Primary Examiner*—Arnold Kinkead
(74) *Attorney, Agent, or Firm*—Mintz Levin Cohn Ferris Glovsky and Popeo PC

(57) ABSTRACT

This invention relates to an oscillator that includes first and second switching elements that each have a control terminal, and first and second conduction terminals. The control terminal of the second switching element is coupled to the first conduction terminal of the first switching element, and the control terminal of the first switching element is coupled to the first conduction terminal of the second switching element. The oscillator also may include first and second capacitive elements, first and second inductive elements, and a resistive element. The first capacitive element may be coupled between the control terminal of the first switching element and a first reference node, and the second capacitive element may be coupled between the control terminal of the second switching element and the first reference node. The first inductive element may be coupled between the control terminal of the first switching element and a second reference node, and the second inductive element may be coupled between the control terminal of the second switching element and the second reference node. The resistive element may be coupled between the second conduction terminals of the switching elements and the first reference node. One or both of the first and second capacitive elements may have a variable capacitance.

26 Claims, 1 Drawing Sheet

DIFFERENTIAL OSCILLATOR

BACKGROUND OF THE INVENTION

1. Field of the Invention

This invention relates generally to oscillator circuits and, more particularly, to a tunable differential oscillator that optionally may have a voltage-controllable oscillation frequency.

2. Related Art

An oscillator is an electric or electronic circuit that produces an output signal that oscillates at a principal oscillation frequency and, in some instances, contains harmonic frequency signals (i.e., signals having frequencies that are multiples of the principal oscillation frequency). Some oscillators have a principal oscillation frequency that may be varied by the application of a suitable control voltage. Oscillators of this type, called voltage-controlled oscillators or VCO's, are used in many communication and other signal-processing applications. Because suppression or reduction of higher-order harmonics of the principal oscillation frequency and other noise in the output signal of a VCO is often desirable, some prior-art VCO's have been designed with so-called "differential" outputs.

One application among many for which differential VCO's and other oscillators have been used is in channel selection (i.e., tuning) for hand-held cellular telephones and other communication devices. Over time, efforts have been made to design such communication devices to be small, light-weight, and inexpensive to manufacture. However, prior oscillators used in such devices have employed numerous electrical and/or electronic components. In some cases, the prior oscillators have required a differential control voltage to effectuate tuning of the principal oscillation frequency of the VCO output signal. Consequently, prior differential VCO's and other oscillators are undesirably large and expensive. This hinders the efforts to reduce the size, weight, and cost of hand-held communication devices employing such oscillators.

SUMMARY

This invention provides oscillators that employ relatively few components thus reducing their complexity, size, weight, and cost. Optionally, differential oscillators may be tunable by, for example, the application of a single tuning signal to a voltage-controlled capacitor or varactor.

In one embodiment, an oscillator includes first and second switching elements, each having a respective control terminal and respective first and second conduction terminals. The control terminal of the second switching element is coupled to the first conduction terminal of the first switching element, and the control terminal of the first switching element is coupled to the first conduction terminal of the second switching element.

In another embodiment, the control terminal of each switching element is directly coupled to the first conduction terminal of the other switching element. For example, the first and second switching elements may comprise transistors. Thus, the first and second switching elements may comprise bipolar transistors, and the control terminals and first and second conduction terminals may comprise the bases, collectors, and emitters of the bipolar transistors.

In addition, some embodiments of oscillators of the invention may include a first capacitive element coupled between the control terminal of the first switching element and a first reference node, and a second capacitive element coupled between the control terminal of the second switching element and a second reference node. The first and second reference nodes may be the same or different, and the first and second capacitive elements may, but need not have substantially equal capacitance. In some embodiments, one of the first and second capacitive elements may have a variable capacitance and may comprise a varactor.

Other embodiments of oscillators according to the invention also may include a first inductive element coupled between the control terminal of the first switching element and a first reference node, and a second inductive element coupled between the control terminal of the second switching element and a second reference node. In some embodiments, the first and second reference nodes may be commonly connected, and a voltage supply may be coupled to the commonly connected first and second reference nodes. Further, the first and second inductive elements may have substantially equal inductance.

Also, the second conduction terminals of the first and second switching elements may be connected to one another in some embodiments, and a resistive element may be coupled between the commonly connected second conduction terminals of the switching elements and a reference node.

Other systems, methods, features and advantages of the invention will be or will become apparent to one with skill in the art upon examination of the following figures and detailed description. It is intended that all such additional systems, methods, features and advantages be included within this description, be within the scope of the invention, and be protected by the accompanying claims.

BRIEF DESCRIPTION OF THE FIGURES

The components in the figures are not necessarily to scale, emphasis instead being placed upon illustrating the principles of the invention. Moreover, in the figures, like reference numerals designate corresponding parts throughout the different views.

DETAILED DESCRIPTION

Figure 1:
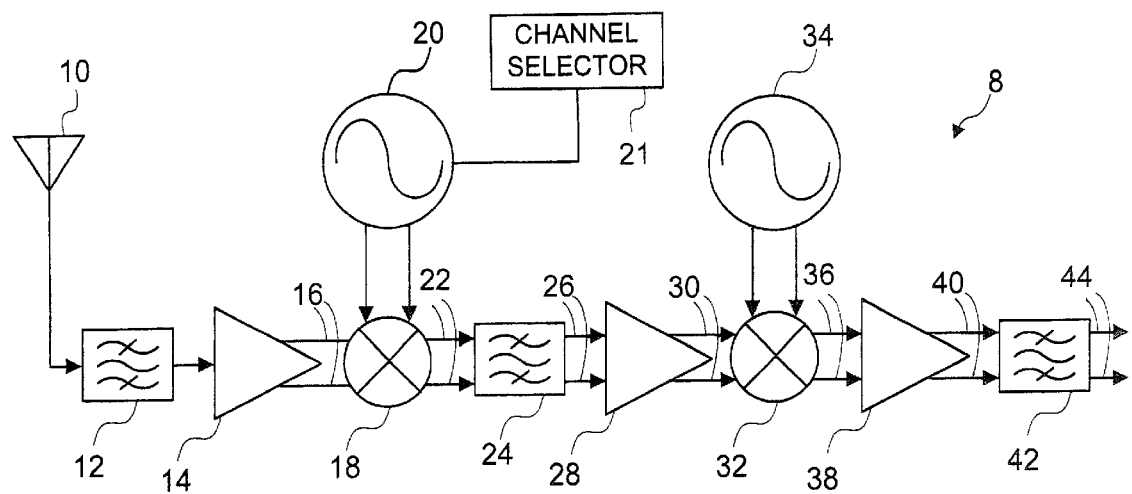
FIG. 1 is an illustration of a block diagram that depicts an exemplary GSM receiver system.

Oscillators (including, without limitation, differential VCO's), find application in various communication devices such as wireless communication devices. One example of such a device is a Global System for Mobile (GSM) receiver. FIG. 1 illustrates, in block-diagram form, an exemplary GSM receiver incorporating one or more differential oscillators.

FIG. 1 illustrates a GSM receiver 8 for use in a GSM communication system. An antenna 10 is connected to a filter 12 for receiving GSM communication signals. Air-based signals received on the antenna 10 are filtered through an RF bandpass filter 12 that passes only a band of frequencies occupied by communication channels used for the GSM communication system. For example, the filter 12 may have a pass-band of 935–960 Megahertz, that may provide bandwidth for 125 GSM communication channels. The filter 12 thus eliminates or reduces noise signals at frequencies above and below the frequencies used for the 125 GSM communication channels.

The GSM communication channels are then amplified by a differential amplifier 14 coupled to an output of the filter 12. The amplifier 14 amplifies the signal output by the filter 12 and produces an amplified signal on differential conductors 16. A main mixer 18 coupled to the differential conductors 16 mixes the amplified signal with the output of an oscillator 20, that may but need not be a differential oscillator.

A channel selector 21 provides a tuning signal to the differential oscillator 20, that enables the differential oscillator 20 to produce an output that oscillates at a frequency corresponding to a desired GSM communication channel. More particularly, in the illustrated example, the GSM communication band spans twenty-five megahertz from 935 MHz to 960 MHz and includes 125 GSM communication channels of 200 kHz each. To enable selection from among these GSM communication channels, the differential oscillator 20 produces an output that is tunable in 200 kHz steps from 1335 MHz to 1360 MHz, such that the differential oscillator 20 can be tuned by the channel selector 21 to a frequency associated with any desired one of the 125 GSM communication channels. In particular, the channel selector 21 produces an output voltage that causes the differential voltage-controlled oscillator 20 to oscillate at a frequency corresponding to the GSM communication channel selected via the channel selector 21. In this way, when the tuning signal output by the differential oscillator 20 is mixed with the output of the amplifier 14 by the main mixer 18, a first mixed signal having a 200 kHz bandwidth is produced across a pair of differential output conductors 22 of the main mixer 18. Thus, in the illustrated example, the first mixed signal has a base frequency of 400 MHz (the difference between the frequency of the output of the differential VCO 20 and the frequency of the amplified signal on differential conductors 16) and contains the particular 200 kHz GSM communication channel selected by the channel selector 21. An intermediate-frequency filter 24 having a passband at 400 MHz with a 200 kHz bandwidth is coupled to the pair of differential output conductors 22 and receives the first mixed signal therefrom. The filter 24 provides amplitude-attenuation in frequency bands containing non-selected channels and thus provides a filtered signal across a pair of differential conductors 26.

The differential conductors 26 are coupled to an amplifier 28 that amplifies the filtered signal to produce an amplified selected-channel signal across a pair of differential conductors 30. The pair of differential conductors 30 are coupled to an auxiliary mixer 32. The auxiliary mixer 32 receives the amplified selected-channel signal and mixes it with a 385.4 MHz fixed-frequency signal produced by an auxiliary differential VCO 34 (which may, but need not be, a differential oscillator) to down-convert the amplified "selected-channel" signal to a frequency of 14.6 MHz, which is required for further processing by other circuitry (not shown) within the GSM receiver 8: The auxiliary mixer 32 produces the down-converted signal across a pair of differential output conductors 36, that in turn, are coupled to an amplifier 38.

The down-converted 14.6 MHz signal containing the selected GSM communication channel is amplified by the amplifier 38 and passed via a pair of differential output conductors 40 to a band-pass filter 42. The base band filter 42 has a substantially 200 kHz pass-band at 14.6 MHz. The filter 42 provides further suppression of unwanted frequencies and provides an output signal across a pair of differential output conductors 44 for use by digital-signal-processing (DSP) circuitry of the GSM receiver 8.

Figure 2:
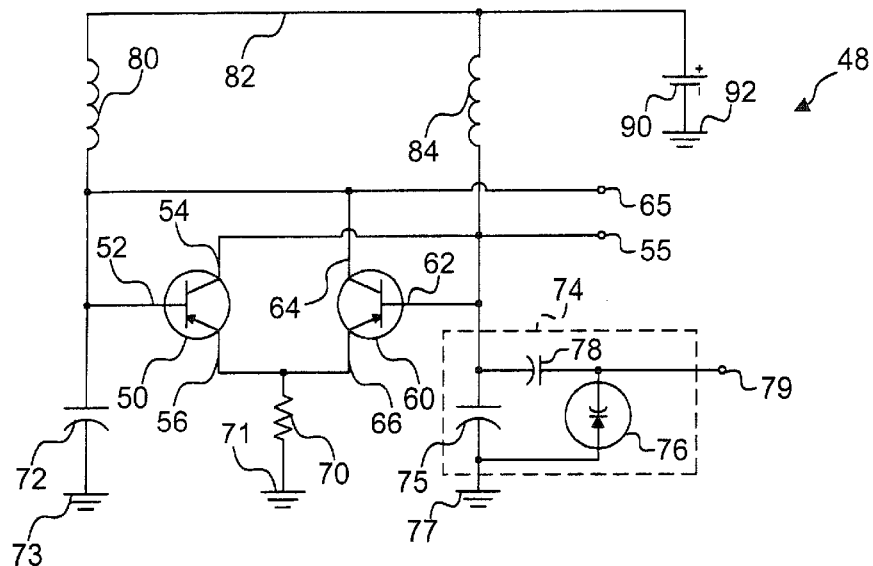
FIG. 2 is an illustration of a schematic diagram of a differential voltage-controlled oscillator circuit.

FIG. 2 illustrates one embodiment of an oscillator 48 that can be used, for example, in the GSM receiver 8 of FIG. 1. The oscillator 48 includes first and second switching elements; the switching elements can be, as shown in the illustrated example, a first bipolar transistor 50 having a base 52 (serving as a "control terminal"), a collector 54 (serving as a "first conduction terminal"), and an emitter 56 (serving as a "second conduction terminal"), and a second bipolar transistor 60 having a base 62, a collector 64, and an emitter 66. In this example, other types of transistors or other types of switching elements may be used as well. In the example, the base 52 of the first bipolar transistor 50 may be directly coupled to the collector 64 of the second bipolar transistor 60 (i.e., without a coupling capacitor or other intervening circuit element). The base 62 of the second bipolar transistor 60 may be directly coupled to the collector 54 of the first bipolar transistor 50. Thus, a coupling capacitor need not be provided between the base of either one of the bipolar transistors and the collector of the other bipolar transistor. The emitters 56 and 66 of the first and second bipolar transistors 50 and 60, respectively, are commonly coupled through a resistor 70 or other resistive element to a ground node 71 or other suitable reference node.

The base 52 of the first bipolar transistor 50 is coupled through a capacitor 72 or other capacitive element to a ground node 73 or other suitable reference node. Likewise, the base 62 of the second bipolar transistor 60 is also coupled through a capacitive element 74 to a ground node 77 or other suitable reference node. The capacitive element 74 may comprise a capacitor 75 connected in parallel with a voltage-variable capacitor (e.g., a varactor) 76, that provides a variable capacitance that varies based on a voltage input, and a DC-blocking capacitor 78 connected in series with the voltage-variable capacitor 76. The DC-blocking capacitor 78 is coupled between the voltage-variable capacitor 76 and the base 62 of the second bipolar transistor 60 to provide for DC-isolation of the voltage-variable capacitor 76. A terminal 79 is provided for coupling a control voltage to the capacitive element 74.

The capacitive element 74 may have a variable capacitance, the variability of which may be provided by any suitable means in addition to, or instead of, the voltage-variable capacitor or varactor 76. For example, in the illustrated embodiment, the capacitor 75 is connected in parallel with the varactor 76 to additively provide a variable total capacitance. However, the parallel combination of the capacitor 75 and the varactor 76 could be replaced, if desired, by a single varactor providing the appropriate capacitance range or by any other suitable capacitive element (e.g., a mechanically variable capacitor). Of course, a DC-blocking capacitor may still be used to provide DC-isolation of the single varactor. Further, while the capacitor 72 shown in FIG. 2 has a fixed capacitance, that capacitor also could be replaced with a varactor, a parallel combination of a varactor and a capacitor, or any other variable capacitive element, if desired.

An inductor 80 or other inductive element is coupled between the base 52 of the first bipolar transistor 50 (and hence also the collector 64 of the second bipolar transistor 60) and a reference node 82. Similarly, an inductor 84 or other inductive element is coupled between the base 62 of the second bipolar transistor 60 (and, hence also the collector 54 of the first bipolar transistor 50) and the reference node 82. As will be apparent to those of ordinary skill in the art, the inductors 80 and 84 or other inductive elements should be selected to have a suitably high quality factor or "Q" value for the oscillation frequency range within which the oscillator circuit 48 is to be tunable.

A voltage supply (e.g., a battery 90 in the illustrated embodiment) is coupled between the reference node 82 and a ground node or other reference node 92.

The resistance, capacitance, and inductance values for the circuit elements of the VCO 48 shown in FIG. 2 depend upon the electrical requirements of the particular application in which the VCO 48 is to be used. However, typical values for the circuit elements of the VCO 48 are as follows: resistor 70 (2 kΩ); capacitors 72 and 75 (10 pF); and varactor 76 (1–3 pF with an applied voltage ranging from 0–3 V); and inductors 80 and 84 (12 nH). The battery 90 may have a voltage of about 2.7 volts.

The oscillator 48 produces a differential output signal at a selected fundamental frequency between the collectors 54 and 64 of the first and second bipolar transistors 50 and 60, respectively (i.e., across corresponding terminals 55 (the base of and 65)). The differential output signal has a good sinusoidal waveform which is low in harmonics and, in particular, is very low in even-order harmonics of the fundamental frequency. Even-ordered harmonics of the selected fundamental frequency of the differential output signal may be obtained between the commonly coupled emitters 56 and 66 of the first and second bipolar transistors 50 and 60 and the ground node 71 (i.e., across the resistor 70). The differential output signal advantageously has low harmonic content (particularly for even-ordered harmonics of the selected fundamental frequency), and the even-ordered harmonics obtainable across the resistor 70 are substantially free of the selected fundamental frequency of the differential output signal.

Further, the illustrated oscillator 48 advantageously has a low operating current requirement (about 2 mA) and is tolerant of the imbalance created by tuning the single varactor 76. Consequently, the oscillator 48 requires relatively few components and can thus be manufactured more compactly, inexpensively and operated more efficiently than other oscillators that require multiple tuning elements (e.g., variable capacitances and associated control voltages) and other additional components (e.g., bias resistors for transistor bases and collectors, capacitances in the path from the base of one transistor to the collector of another, etc.) to achieve a stable oscillation frequency. As illustrated by the embodiment of FIG. 2, these additional components may be omitted from some oscillators.

While various embodiments of the invention have been described, it will be apparent to those of ordinary skill in the art that many more embodiments and implementations are possible that are within the scope of this invention. Accordingly, the invention is not to be restricted except in light of the attached claims and their equivalents.

What is claimed is:

1. An oscillator comprising:
   a first switching element having a control terminal and first and second conduction terminals;
   a second switching element having a control terminal and first and second conduction terminals;
   a first capacitive element coupled between the control terminal of the first switching element and a first reference node;
   a second capacitive element coupled between the control terminal of the second switching element and a second reference node;
   wherein at least one of the first and second capacitive elements has an isolated variable capacitance, the control terminal of the second switching element is coupled to the first conduction terminal of the first switching element, and the control terminal of the first switching element is coupled to the first conduction terminal of the second switching element, and wherein the oscillator produces a differential sinusoidal signal across the control terminals of the first and second switching elements, the differential sinusoidal signal having a principle frequency and substantially attenuated harmonics of the principle frequency.

2. The oscillator of claim 1, wherein the first and second capacitive elements have substantially equal capacitance.

3. The oscillator of claim 1, wherein the second capacitive element has a fixed capacitance, and wherein the variable capacitance of the first capacitive element is variable within a range that includes a fixed capacitance of the second capacitive element.

4. The oscillator of claim 1, further comprising a first inductive element coupled between the control terminal of the first switching element and a third reference node, and a second inductive element coupled between the control terminal of the second switching element and a fourth reference node.

5. The oscillator of claim 4, wherein the first and second reference nodes are commonly connected.

6. The oscillator of claim 5, further comprising a voltage supply coupled to commonly connected third and fourth reference nodes.

7. The oscillator of claim 4, wherein the first and second inductive elements have substantially equal inductance.

8. The oscillator of claim 1, wherein the control terminal of at least one of the first and second switching elements is directly connected to the first conduction terminal of the other of the first and second switching elements.

9. The oscillator of claim 8, wherein the control terminal of the first switching element is directly coupled to the first conduction terminal of the second switching element and the control terminal of the second switching element is directly coupled to the first conduction terminal of the first switching element.

10. The oscillator of claim 1, wherein the second conduction terminals of the first and second switching elements are connected to one another.

11. The oscillator of claim 10, further comprising a resistive element coupled between the second conduction terminals of the switching elements and a reference node.

12. An oscillator; comprising:
   a first switching element, having a control terminal and first and second conduction terminals;
   a second switching element having a control terminal and first and second conduction terminals;
   a resistive element coupled between the second conduction terminals of the switching elements and a reference node;
   a first capacitive element coupled between the control terminal of the first switching element and the reference node; and,
   a second capacitive element coupled between the control terminal of the second switching element and the reference node; wherein at least one of the first and second capacitive elements has an isolated variable capacitance,
   wherein the control terminal of the second switching element is coupled to the first conduction terminal of the first switching element, the control terminal of the first switching element is coupled to the first conduction terminal of the second switching element, and the second conduction terminals of the first and second switching elements are connected to one another, and wherein the oscillator produces a differential sinusoidal signal across the control terminals of the first and second switching elements, the differential sinusoidal signal having a principle frequency and substantially attenuated harmonics of the principle frequency.

13. A circuit, comprising:

first and second transistors, each respectively having a base, a collector, and an emitter, where the base of the second transistor is coupled to the collector of the first transistor, the base of the first transistor is coupled to the collector of the second transistor, and the emitters of the first and second transistors are coupled together;

a first capacitive element coupled between the base of the first transistor and a first reference node;

a second capacitive element coupled between the base of the second transistor and the first reference node;

a first inductive element coupled between the base of the first transistor and a second reference node;

a second inductive element coupled between the base of the second transistor and the second reference node; and a resistive element coupled between the emitters of the transistors and the first reference node;

wherein at least one of the first and second capacitive elements has an isolated variable capacitance.

14. The circuit of claimed 13, further comprising a voltage supply coupled between the first and second reference nodes.

15. The circuit of claim 13, wherein the second capacitive element has a fixed capacitance, and wherein the variable capacitance of the first capacitive element is variable within a range that includes a fixed capacitance of the second capacitive element.

16. The circuit of claim 13, wherein the base of at least one of the first and second transistors is directly coupled to the collector of the other of the first and second transistors.

17. A circuit, comprising:

first and second transistors, each respectively having a base, a collector, and an emitter, where the base of the second transistor is coupled to the collector of the first transistor, the base of the first transistor is coupled to the collector of the second transistor, and the emitters of the first and second transistors are coupled together;

a first capacitive element coupled between the base of the first transistor and a first reference node;

second capacitive element coupled between the base of the second transistor and the first reference node;

a first inductive element coupled between the base of the first transistor and a second reference node;

a second inductive element coupled between the base of the second transistor and the second reference node; and a resistive element coupled between the emitters of the transistors and the first reference node; wherein at least one of the first and second capacitive elements has an isolated variable capacitance, wherein each of the first and second inductive elements has an inductance of about twelve nanohenrys, each of the first and second capacitive elements has a capacitance on the order of ten picofarads, and the resistive element has a resistance of about two kilohms.

18. An oscillator, comprising:

first switching means for controlling conduction between first and second conduction terminals of the first switching means via a control terminal of the first switching means;

second switching means for controlling conduction between first and second conduction terminals of the second switching means via a control terminal of the second switching means;

first capacitive means coupled between the control terminal of the first switching means and a first reference node for providing a first capacitance therebetween; and second capacitive means coupled between the control terminal of the second switching means and a second reference node for providing a second capacitance therebetween;

wherein at least one of the first and second capacitive means provides an isolated variable capacitance, the control terminal of the second switching means is coupled to the first conduction terminal of the first switching means, and the control terminal of the first switching means is coupled to the first conduction terminal of the second switching means.

19. The oscillator of claim 18, wherein at least one of the first and second capacitive means comprises a varactor.

20. An oscillator, comprising:

first switching means for controlling conduction between first and second conduction terminals of the first switching means via a control terminal of the first switching means;

second switching means for controlling conduction between first and second conduction terminals of the second switching means via a control terminal of the second switching means;

first capacitive means coupled between the control terminal of the first switching means and a first reference node for providing a first capacitance therebetween; and second capacitive means coupled between the control terminal of the second switching means and a second reference node for providing a second capacitance therebetween;

wherein the first and second reference nodes are the same, the control terminal of the second switching means is coupled to the first conduction terminal of the first switching means, and wherein the control terminal of the first switching means is coupled to the first conduction terminal of the second switching means, wherein at least one of the first and second capacitive means provides an isolated variable capacitance, wherein the first and second switching means comprise respective first and second transistors, and wherein the control terminal of each switching means is a base of the respective transistor, the first conduction terminal of each switching means is a collector of the respective transistor, and the second conduction terminal of each switching means is an emitter of the respective transistor, and wherein the base of at least one of the first and second transistors is directly connected to the collector of the other of the first and second transistors.

21. The oscillator of claim 20, further comprising first inductive means coupled between the base of the first transistor and a third reference node for providing a first inductance therebetween, and second inductive means coupled between the base of the second transistor and a fourth reference node for providing a second inductance therebetween.

22. The oscillator of claim 21, wherein the third and fourth reference nodes are commonly connected.

23. The oscillator of claim 22, further comprising a voltage supply coupled to the commonly connected third and fourth reference nodes.

24. The oscillator of claim 20, wherein the emitters of the first and second transistors are connected to one another.

25. The oscillator of claim 24, further comprising resistive means coupled between the emitters of the transistors and a reference node.

26. The oscillator of claim 25, further comprising a first capacitive means coupled between the base of the first transistor and the first reference node, and a second capacitive means coupled between the base of the second transistor and the second reference node.

* * * * *